United States Patent [19]

Kohn et al.

[11] Patent Number: 4,774,555
[45] Date of Patent: Sep. 27, 1988

[54] POWER HEMT STRUCTURE

[75] Inventors: Erhard Kohn, Titusville; Mark E. Schneider, Lawrenceville; Chia-Jen Wu, Somerset, all of N.J.

[73] Assignee: Siemens Corporate Research and Support, Inc., Iselin, N.J.

[21] Appl. No.: 83,751

[22] Filed: Aug. 7, 1987

[51] Int. Cl.[4] .................. H01L 29/80; H01L 29/56
[52] U.S. Cl. ........................ 357/22; 357/15; 357/55; 437/203
[58] Field of Search .............. 357/22, 15, 16, 55; 437/39, 203

[56]           References Cited
         U.S. PATENT DOCUMENTS 3,813,585  5/1974  Tarui et al. ................. 357/22
4,503,600  3/1985  Nii et al. .................... 357/22
4,517,730  5/1985  Meignant .................... 357/15

FOREIGN PATENT DOCUMENTS 61-164270  7/1986  Japan ....................... 357/22

OTHER PUBLICATIONS

Technical Digest, International Electron Devices Meeting 1986, Los Angeles, CA; Dec. 7–10, 1986; pp. 456-IEDM86–IEDM86-459.

Primary Examiner—Andrew J. James
Assistant Examiner—John Lamont
Attorney, Agent, or Firm—Adel A. Ahmed

[57]           ABSTRACT

A modulation-doped field effect transistor comprises a gate recess through a top insulating layer, having a cross-section in a semiconductor layer increasing down to an interface with a further semiconductor layer and thereafter having a cross-section in the further semiconductor layer decreasing down to the bottom of the recess in the further semiconductor layer. A gate electrode is formed in the recess.

7 Claims, 1 Drawing Sheet

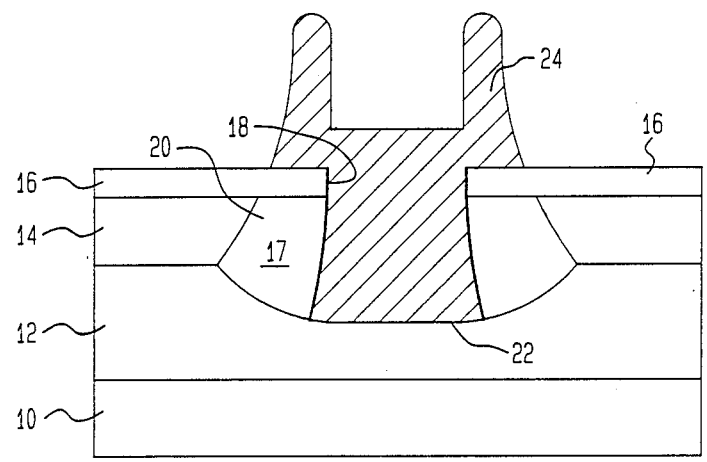

POWER HEMT STRUCTURE

The present invention relates to field effect transistors and more particularly to modulation-doped high mobility field effect transistors (MODFET), also referred to as high electron mobility transistors (HEMT).

Field effect transistors (FET's) using gallium arsenide (GaAs) are know to be capable of high speed operation. Devices using gallium arsenide/aluminum gallium arsenide (GaAs/AlGaAs) heterostructures form a two-dimensional electron gas (2 DEG). In such devices the donor impurities are confined away from the active channel in which electrons may flow. This separation of donor impurities from the electron layers causes the device to exhibit extremely high electron mobilities and thereby to be capable of extremely fast operation, for example, in high speed switching.

Generally, HEMT structures utilize a narrow recess configuration for the control gate so as to reduce the effects of series resistance regions not subject to gate control. While such a configuration allows a transistor to be constructed with high RF gain and low noise figure, the source to drain breakdown voltage tends to be low, for example, 4-6 volts, because of field crowding at relatively sharp corners where the trapezoidal-shaped sides of the gate recess or trench in the GaAs meet the bottom. Consequently, the breakdown voltage is primarily determined by the geometrical configuration of the gate metal-2DEG interface rather than the doping level in the AlGaAs layer.

While the breakdown voltage may be increased by introducing a separation between the gate metal and the drain recess or trench edge, this is herein recognized to be generally undesirable if it is not narrow and tightly controlled since it can lead to current limiting and current lagging effects associated with surface depletion and field dependent trapping and detrapping effects in the doped AlGaAs as well as other problems including I-V collapse at low temperatures in the dark. Furthermore, while the gate to drain breakdown voltage may be increased by a parasitic gate to drain voltage drop, this does not result in an increase of RF output power.

In accordance with an aspect of the invention, a modulation doped field effect transistor comprises a first semiconductor layer having a second semiconductor layer formed thereon. An insulating layer which is to be used as an etch mask in fabrication is formed on the second semiconductor layer. A hole for a gate electrode passes through the insulating layer and the second semiconductor layer, and extends into the first semiconductor layer. The wall portions of the hole in the first and second semiconductor layers respectively slope in opposite directions.

In accordance with another aspect of the invention, each of the wall portions slopes away from a central axis of the hole, in the direction towards the interface between the first and second semiconductor layers.

In accordance with yet another aspect of the invention, the second semiconductor layer is undercut at its interface with the insulating layer, so that the hole is smaller in the insulating layer than in the second semiconductor layer.

BRIEF DESCRIPTION OF THE DRAWING

The invention will next be described in more detail in conjunction with the drawing in which the sole FIGURE shows an embodiment in accordance with the invention, in cross-section and not to scale.

The FIGURE shows a high electron mobility transistor (HEMT) in accordance with the invention, in which 10 is a GaAs layer, relatively undoped. Adjacent layer 10 is an AlGaAs layer 12, relatively heavily n-doped. This acts as a donor layer and forms a two-dimensional electron gas (2 DEG) in a region of layer 10 adjacent layer 12, which is the active channel. Layer 14 is relatively heavily n-doped GaAs and over this is an insulating layer 16 of, for example, silicon nitride ($Si_3N_4$) which can be etched selectively with respect to the underlying semiconductor layers. A gate trench or recess 17 has a hole portion 18 in layer 16. The hole continues as hole portion 20 in layer 14, hole portion 20 being larger adjacent layer 16 than hole portion 18, so that insulating layer 16 overhangs hole portion 20. Proceeding through semiconductor layer 14, hole portion 20 becomes progressively larger until the interface with semiconductor layer 12. Thereafter, proceeding through semiconductor layer 12, hole portion 20 becomes progressively smaller until a bottom 22 is reached in semiconductor layer 12. In other words, the walls of the gate hole 17 in semiconductor layer 14 slope away from the center in the (downward) direction towards the interface between semiconductor layers 12 and 14 whereas those walls slope away from the center in semiconductor layer 12 in the (upward) direction towards the same interface.

Hole 17 contains a metallic gate electrode 24 formed therein. A gate electrode is being deposited in fabrication, shadowing by insulating layer 16 causes gate electrode 24 substantially not to occupy the portions of the hole 17 in the undercut part. The exact profile of the gate metal edge and the hole edge can be varied by changing the extent of the shielding during deposition provided by insulating layer 16 and by changing the thicknesses of layers 12 and 14, either in total thickness and/or the ratio of respective thicknesses.

The configuration of hole 17 is obtainable by using a $0\bar{1}1$ gate finger orientation on a 100 oriented GaAs substrate, that is, the length horizontally in the plane of the paper in the FIGURE. Since GaAs is etched preferentially, this results in a reentrant recess profile in the $0\bar{1}1$ direction. However AlGaAs is etched non-preferentially and this results in a cylindrical profile independent of the gate orientation. As a result of layers 12 and 14 being AlGaAs and GaAs respectively, the overall resulting shape, as illustrated in the FIGURE has a relatively flat interface between the gate metal bottom and AlGaAs layer 12, blending into a gentle curve towards the sides. Since the gate metal does not fill hole 17 out to its sides, a sharp-cornered interface between gate metal and the GaAs/AlGaAs interface is prevented and an extended thin, flat AlGaAs region adjacent the gate metal is avoided. Accordingly, high electric fields at the recess edge are thereby prevented and the gate to drain breakdown voltage is increased without introducing a thin, parasitic AlGaAs layer adjacent the gate metal. In measurements made with a structure in accordance with the present invention, the gate to drain breakdown voltage was found to be substantially improved.

What is claimed is:

1. A modulation-doped field effect transistor comprising:
    gate electrode means;

a first semiconductor layer;

a second semiconductor layer, formed over said first semiconductor layer so as to form a first interface therewith; and an insulating etch mask layer formed over said second semiconductor layer so as to form a second interface therewith, said insulating etch mask layer having a hole therethrough for a gate electrode, said hole extending through said second semiconductor layer into said first semiconductor layer and having respective first and second wall portions in said first and second semiconductor layers, said first and second wall portions generally exhibiting respective slopes of opposite sign, said gate electrode means being formed in said hole.

2. A modulation-doped field effect transistor as recited in claim 1 wherein each of said first and second wall portions slopes away from a longitudinal axis of said hole in a respective direction towards said first interface.

3. A modulation-doped field effect transistor as recited in claim 2 wherein said hole exhibits a greater cross-section at said second interface in said second semiconductor layer than in said insulating etch mask layer.

4. A modulation-doped field effect transistor as recited in claim 3 wherein said hole reaches a bottom in said first semiconductor layer.

5. A modulation-doped field effect transistor comprising:

gate electrode means;

a first semiconductor layer, being substantially undoped;

a second semiconductor layer of a first conductivity type, formed over said first layer;

a third semiconductor layer, formed over said second semiconductor layer;

an insulating layer formed over said third layer, said insulating layer having a hole of a first cross-section therethrough for receiving a control gate, said hole extending through said third semiconductor layer into said second semiconductor layer to a bottom therein, said hole exhibiting an undercut region under said insulating layer having a second cross-section in said second semiconductor layer immediately below said insulating layer greater than said first cross-section, exhibiting a cross-section in said second semiconductor layer increasing towards said first semiconductor layer to a third cross-section at an interface between said first and second semiconductor layers, and thereafter exhibiting a cross-section in said first semiconductor layer decreasing towards said bottom of said hole to a fourth cross-section at said bottom, said gate electrodes means being formed in said hole.

6. A modulation-doped field effect transistor as recited in claim 5 wherein said gate electrode means comprises a bottom portion thereof abutting said bottom of said hole.

7. A modulation-doped field effect transistor as recited in claim 6 wherein said bottom portion of said gate means exhibits a cross-section smaller than said fourth cross-section.

* * * * *